United States Patent
Gruber et al.

(10) Patent No.: US 6,618,303 B2
(45) Date of Patent: Sep. 9, 2003

(54) INTEGRATED CIRCUIT, TEST STRUCTURE AND METHOD FOR TESTING INTEGRATED CIRCUITS

(75) Inventors: Arndt Gruber, München (DE); Ralf Schneider, München (DE); Bernhard Ruf, Taufkirchen (DE); Norbert Wirth, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/929,303

(22) Filed: Aug. 13, 2001

(65) Prior Publication Data

US 2002/0020854 A1 Feb. 21, 2002

(30) Foreign Application Priority Data

Aug. 11, 2000 (DE) .......................................... 100 39 350

(51) Int. Cl.⁷ .................................................. G11C 7/00
(52) U.S. Cl. .............. 365/201; 365/189.07; 365/230.06
(58) Field of Search ........................... 365/201, 189.07, 365/230.06

(56) References Cited

U.S. PATENT DOCUMENTS

| | | | | |
|---|---|---|---|---|
| 4,038,648 A | * | 7/1977 | Chesley | ....................... 365/201 |
| 5,457,400 A | * | 10/1995 | Ahmad et al. | ............... 324/763 |
| 5,495,448 A | * | 2/1996 | Sachdev | ....................... 365/201 |
| 5,671,183 A | | 9/1997 | Soenen et al. | |
| 6,388,929 B1 | * | 5/2002 | Shimano et al. | ............. 365/201 |

FOREIGN PATENT DOCUMENTS

| | | |
|---|---|---|
| DE | 42 38 114 A1 | 5/1993 |
| JP | 0 803 902 A2 | 10/1997 |

* cited by examiner

*Primary Examiner*—Son T. Dinh
(74) *Attorney, Agent, or Firm*—Laurence A. Greenberg; Werner H. Stemer; Gregory L. Mayback (57) ABSTRACT

An electronic circuit in an integrated circuit having memory cells is described. The circuit permits information to be written to particular memory cells only once, so that subsequent writing to the particular memory cells is blocked. The circuit is used in a test structure for integrated circuits on a wafer. A method for testing integrated circuits on a wafer that are connected to a test apparatus is also described. Once the supply voltage to a first circuit to be tested has been turned on, a preliminary test is carried out to ascertain parameters that need to be set. The supply voltage is then applied to a next circuit to be tested, a preliminary test is carried out, and memory cells have information written to them, until the parameters have been set for all the connected circuits to be tested. The test apparatus then carries out the actual operational test in parallel for all the connected circuits to be tested.

16 Claims, 5 Drawing Sheets

INTEGRATED CIRCUIT, TEST STRUCTURE AND METHOD FOR TESTING INTEGRATED CIRCUITS

BACKGROUND OF THE INVENTION

Field of the Invention

The invention relates to a circuit for testing integrated circuits on a wafer using a test apparatus, a test structure and a method for this purpose. In particular, the invention relates to a method for testing integrated circuits on a wafer.

During their manufacture, semiconductor chips are subjected to a plurality of test methods. The test methods are essentially distinguished by front-end test methods and back-end test methods. The essential difference between the two separate test procedures is that, in the case of front-end test methods, the tests are carried out while the integrated circuits are still unseparated from the wafer, i.e. the wafer has not yet been sawn up into individual chips. In the case of back-end test methods, the individual chips are actually tested separately. The task of the front-end test method is, among other things, to carry out a first operational test for the integrated circuits on the wafer and to find faults. Some of the faults can be eliminated by a subsequent laser process by severing "hard fuses", that is to say special fuses, using a laser and thereby replacing the faulty circuit regions with redundant circuits already provided on the chip. Such a laser process, also called laser trimming, needs to be carried out before the integrated circuits on the wafer are cut up into chips, because aligning individual chips in the laser apparatus creates considerable difficulties and would thus be very time-consuming and cost-intensive. By contrast, severing the hard fuses in an integrated circuit on the wafer that has not been sawn up is comparatively easy to do. For this reason, it is necessary to find out in the actual front-end test method which hard fuses mounted on the respective integrated circuit need to be severed in the subsequent laser process.

Particularly where reference voltages are produced internally in the chip, the manufacturing process results in fluctuations in the reference voltage produced from chip to chip. The fluctuations become particularly noticeable in the case of analog voltages because these small discrepancies from the reference value can have considerable effects on the operation of the circuit. Analog reference voltages can therefore move only within a certain tolerance range or need to be suited to the operation of the entire component. Whereas, previously, integrated circuits in which the reference voltage differed from the required voltage by more than a particular percentage were regarded as rejects, practice has now been changed to making the reference voltage settable on the respective chip, in order thus to obtain a virtually identical functionality for each individual chip. The setting of the reference voltage is effected using the laser trimming process described above.

The previous method of applying such a reference voltage externally during the operational tests to the circuit to be tested has the drawback that, between the externally applied voltage source and the contact on the integrated circuit, a voltage drop occurs which cannot be foreseen on account of the unknown currents which flow. Since, however, it is desirable to test the integrated circuits under the conditions of their later operation as far as possible, to which end the analog reference voltage potentials need to be applied appropriately inside the integrated circuit during testing, it is advantageous for the reference voltage to be provided internally in the chip for the actual front-end testing.

This now requires that the integrated circuit be set individually in the actual front-end test method, i.e. it is necessary to find out which of the hard fuses in an integrated circuit are severed in the later laser trimming process, and which are not. However, for reasons of throughput, conventional front-end test apparatuses always test a plurality of integrated circuits on a wafer at the same time and, in this context, supply each of the circuits with the same test pattern.

The test procedure first establishes which of the hard fuses need to be severed for the optimum setting in a subsequent laser process. Next, "soft fuses" are set. The soft fuses are memory cells that simulate the operation of the hard fuses during the test procedure in the integrated circuit. The settings then start the actual test method. In conventional test apparatuses, such setting of the soft fuses respectively affects all of a test run's integrated circuits connected in parallel. Individual setting is not possible, because the individual circuits cannot be addressed separately from one another by the test apparatus. However, it is usually possible for supply voltages supplying the individual integrated circuits to be turned on individually in conventional test apparatuses. Since the amount of time required for testing a chip is relatively great (approximately 30 minutes), it is not feasible, for reasons of economic viability, to set and test the chips successively.

SUMMARY OF THE INVENTION

It is accordingly an object of the invention to provide an integrated circuit, a test structure and a method for testing integrated circuits which overcome the above-mentioned disadvantages of the prior art devices and methods of this general type, in which it is possible, before a parallel operational test for a plurality of integrated circuits on a wafer, to be able to make individual settings for parameters in the circuits to be tested.

With the foregoing and other objects in view there is provided, in accordance with the invention, an integrated circuit containing memory cells for storing test parameters; and an electronic circuit for carrying out an operational test and connected to the memory cells. The electronic circuit applies an operating signal and permits a single write operation to the memory cells and prevents any further writing to the memory cells.

The invention provides a circuit that has an electronic circuit as an aid to carrying out an operational test. The operational test is carried out by a test apparatus. Connected to the test apparatus are a plurality of integrated circuits which are supplied with test patterns in parallel and whose supply voltages can be applied individually by the test apparatus. The integrated circuit contains memory cells, for storing test parameters, which can have information written to them by the test apparatus and on which the operation of the respective integrated circuits depends. To prevent the memory cells in the connected integrated circuits from each receiving the same content, the invention provides that, once an operating signal, preferably a supply voltage, has been applied to the integrated circuit by the circuit, a single write operation to the memory cells is permitted, and thereafter further writing to the memory cells is prevented. This makes it possible for the integrated circuits to be successively provided with their individual settings as a result of writing to memory cells, without memory cells which have already had information written to them being overwritten.

The invention also provides a test structure having a test apparatus to which a plurality of such integrated circuits are connected. The test apparatus is able to turn the supply voltages for the integrated circuits on and off individually, which allows an individual response from the individual integrated circuits as a result of applied test patterns.

The inventive method involves ascertaining the parameters to be set in a preliminary test after the supply voltage to a first integrated circuit has been turned on. On the basis of the parameters obtained, memory cells in the first integrated circuit have information written to them. After that, the supply voltage is applied to a next integrated circuit, a preliminary test is carried out, and memory cells have information written to them on the basis of the parameters obtained. This is carried out until the parameters have been set for all the connected integrated circuits. Next, the actual operational test is then carried out by the test apparatus for all the integrated circuits in parallel. Therefore, for the actual first operation test, the integrated circuits are placed into an operating mode, in which they are actually operated in their later application.

In one advantageous refinement, provision may be made for the electronic circuit to have an input and an output, the input receiving a control signal for writing to the memory cells. The control signal at the input is transmitted to the output for the single write operation to the memory cells and is then blocked so long as the supply voltage is applied to the electronic circuit. This assures the single write operation to the memory cells by virtue of a Write-Enable signal for the memory cells concerned being applied to the appropriate inputs of the memory cells, or isolated therefrom. Since information can be written to the memory cells only when a Write-Enable signal is applied, this ensures that information can be written to the memory cells only once, namely after a supply voltage has been applied and the Write-Enable signal has subsequently been applied.

In one preferred embodiment, the electronic circuit has a flipflop, a pulse generator and a gate. The gate is connected such that it transmits or does not transmit a control signal at its input on the basis of the output signal from the flipflop. The flipflop is connected such that it adopts a first state after the supply voltage has been turned on, and changes to a second state when the pulse generator connected to one input of the flipflop outputs a pulse to the flipflop as a result of a control signal applied to the input of the pulse generator. This advantageously ensures that the control signal, i.e. the Write-Enable signal for the memory cells, is not forwarded to the memory cells as soon as a control signal has actually been applied to the memory cells. In addition, the additional complexity for such a circuit is very low and can easily be integrated into an existing control signal line by use of the gate.

Preferably, another provision may be for the integrated circuit to have severable lines, the memory cells simulating the operation of the severed or unsevered lines. The severable lines are "hard fuses", which can make permanent settings to the integrated circuits, e.g. in a laser trimming process. Severing or not severing the lines cannot be used to make settings during the actual operational test, however, since these settings are irreversible and therefore permit no further change to the set parameters. To be nevertheless able to test the integrated circuits, during an operational test, in the manner in which they are operated in their later application, their operation can be simulated by the memory cells as though coding of the severable lines, i.e. the action in a laser process, had already taken place. Therefore, these memory cells can have settings written to them that have previously been found out in a preliminary test, and these settings can be changed as required should they prove not to be optimum.

In another advantageous refinement, provision may be made for the memory cells to be used to set an internal reference voltage. In this case, by way of example, the memory cells form a reference voltage source in connection with an integrated digital/analog converter. Since the properties of the digital/analog converter, e.g. individual voltages, differ from one another on account of process-related discrepancies, a preliminary test makes it possible to find out the optimum setting of the memory cells at which the internal reference voltage corresponds to the desired voltage, or at which the internal reference voltage achieves the desired operation in the integrated circuit.

In accordance with another preferred embodiment, such integrated circuits can be connected to a test apparatus that can turn the supply voltages for the integrated circuits on or off individually. This advantageously ensures that the preliminary test used to determine the individual parameters of the integrated circuit can be carried out individually for each circuit. This makes it possible to save time when determining the parameters, since the preliminary test does not need to perform any standard routines, but instead individually matched program procedures geared to the operation obtained by the parameters.

In another advantageous embodiment, a plurality of integrated circuits connected in parallel are connected to the outputs of the test apparatus. The integrated circuits are tested using identical test patterns, which allows the operation test to be carried out in parallel and thus with a great time saving.

Preferably, provision may be made for the test apparatus to supply the supply voltage successively to the integrated circuits connected in parallel. Each of the integrated circuits already supplied thus remains supplied with the supply voltage until completion of the operation test. In this way, the connected integrated circuits can be addressed individually in order to carry out the preliminary test, i.e. in order to determine the parameters and to write the parameters to the memory cells. Once the preliminary test has been carried out for a particular integrated circuit, the supply voltage needs to continue to be applied so that the settings stored in the memory cells are maintained.

In one preferred embodiment of the inventive method, the individual parameters determined by a preliminary test are written by successively turning on the supply voltage on one of the circuits and then writing the respective parameters to the memory cells. This is carried out until all the connected integrated circuits have been set. In one preferred embodiment, the individual parameters can be determined iteratively. In this context, after turning on a supply voltage on one of the integrated circuits, arbitrary or prescribed parameters are first written to the memory cells and are then checked on the basis of particular test patterns to determine whether the optimum operation of the integrated circuit has been achieved. This procedure is repeated, by suitably altering the parameters, until the parameters for the optimum operation of the integrated circuit have been found out. In this context, for each new write operation to the memory cells, it is necessary first to turn off the supply voltage and to turn it on again after a particular time, in order to erase the contents of the memory cells and to allow a new write operation. This ensures that the optimized parameters for each of the integrated circuits can be set individually.

Preferably, provision may also be made for the parameters to be prevented from being written to the memory cells if information has already been written thereto by a preceding step. This has the advantage that, when different parameters are to be written to the memory cells, the memory cells in the circuit already described retain their contents.

Other features which are considered as characteristic for the invention are set forth in the appended claims.

Although the invention is illustrated and described herein as embodied in an integrated circuit, a test structure and a method for testing integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
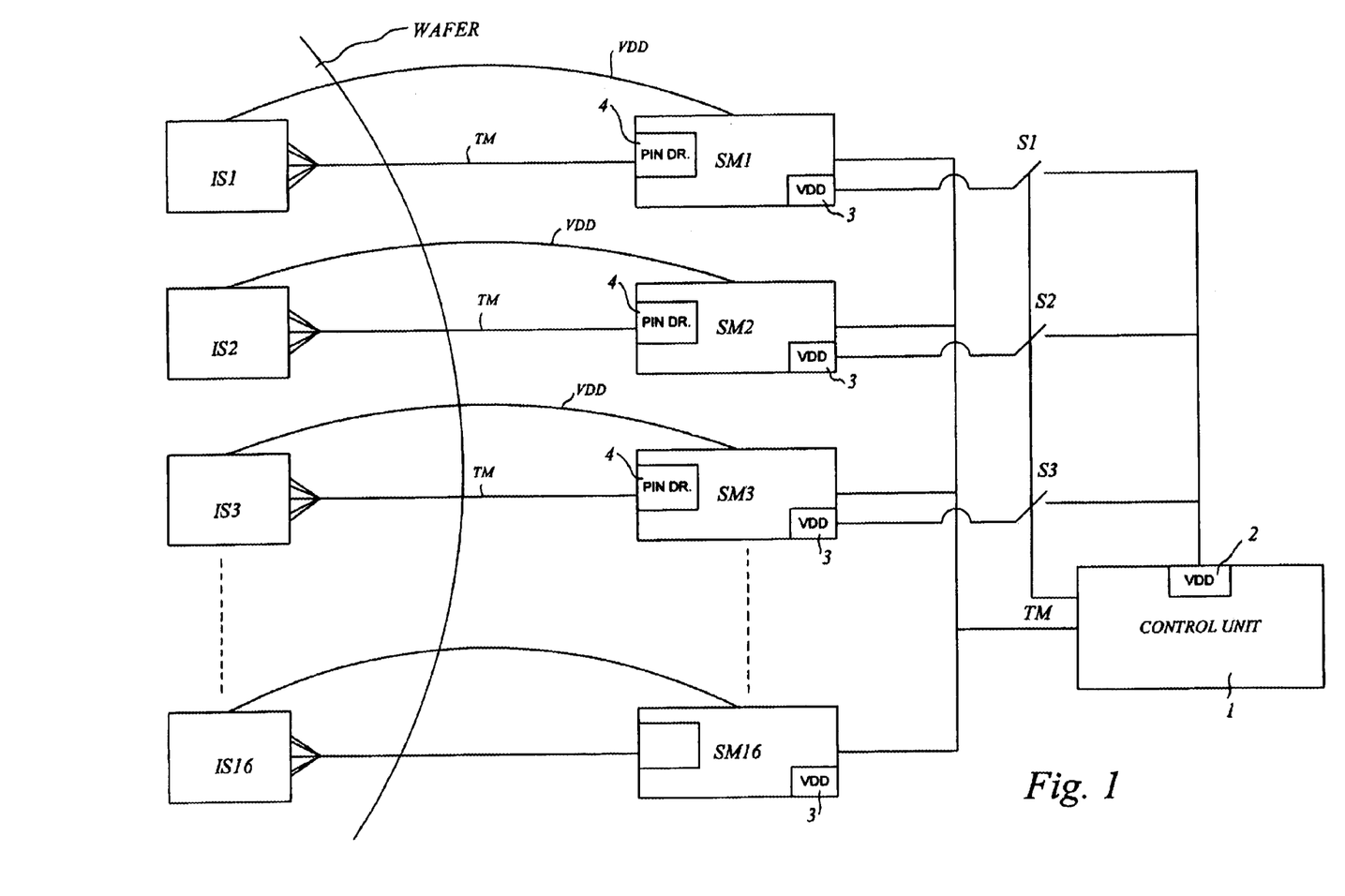
FIG. 1 is a block circuit diagram of a front-end tester apparatus having sixteen parallel interfaces according to the invention.

In all the figures of the drawing, sub-features and integral parts that correspond to one another bear the same reference symbol in each case. Referring now to the figures of the drawing in detail and first, particularly, to FIG. 1 thereof, there is shown a schematic layout of an inventive test structure having connections for sixteen integrated circuits IS1–IS16 on a wafer. The sixteen integrated circuits IS1–IS16 are addressed by switching modules SM1 to SM16 which are driven by a control unit 1. Each of the switching modules SM1–SM16 has a voltage supply 3, which can be connected by a test apparatus to the integrated circuits IS1–IS16, and a PIN driver 4. The switching modules SM1–SM16 can be connected separately by the control unit 1 to a supply voltage 2 (VDD) using the switches S1–S16 of which only S1–S3 are illustrated. The respective switching modules SM1–SM16 are used to supply test patterns TM supplied by the test apparatus in parallel to all the circuits to be tested.

Figure 2A:
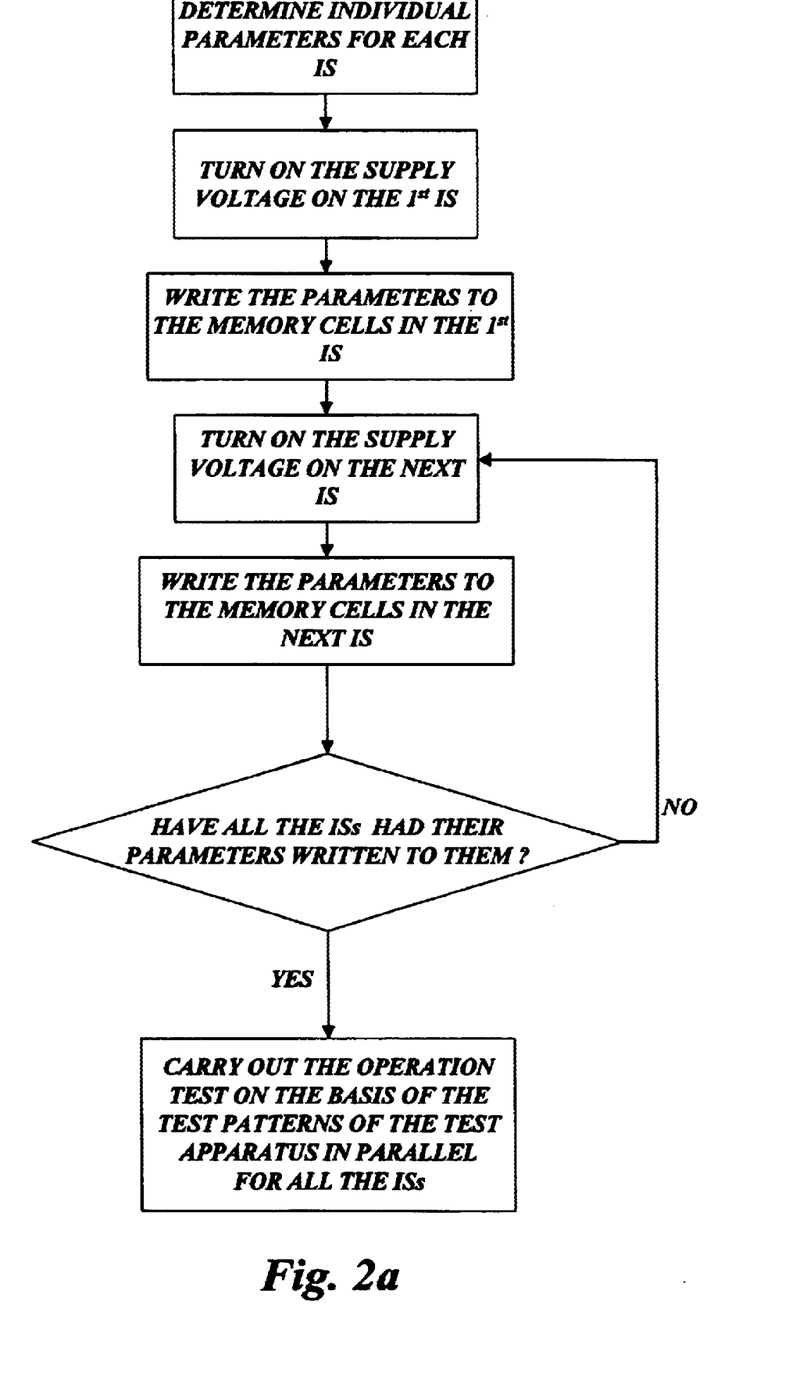
FIG. 2a is a flow chart of test procedures in accordance with a first embodiment.

One inventive method for testing a plurality of integrated circuits is shown in FIG. 2a. Before the start of the actual operational test, a suitable method is used to determine the parameters that are optimum for the operation of the respective integrated circuit, step 10. Possible methods of parameter determination are discussed further below. Next, the switching module SM1 is connected to the supply voltage VDD by the switch S1, step 20, and the required parameters are written to memory cells MC of the respective integrated circuit by the control unit 1 on the basis of the respective specification for the circuit, step 30. The next switching module SM2 is then supplied with the supply voltage VDD, so that the integrated circuit IS2 connected thereto is activated, step 40. The parameters concerned are now likewise written to the memory cells MC in the known manner, step 50. This procedure is repeated until the respective parameters have been written to the memory cells MC in all the connected integrated circuits, step 60. The operational test is then carried out by the test apparatus in parallel for all the connected integrated circuits, step 70.

Figure 2B:
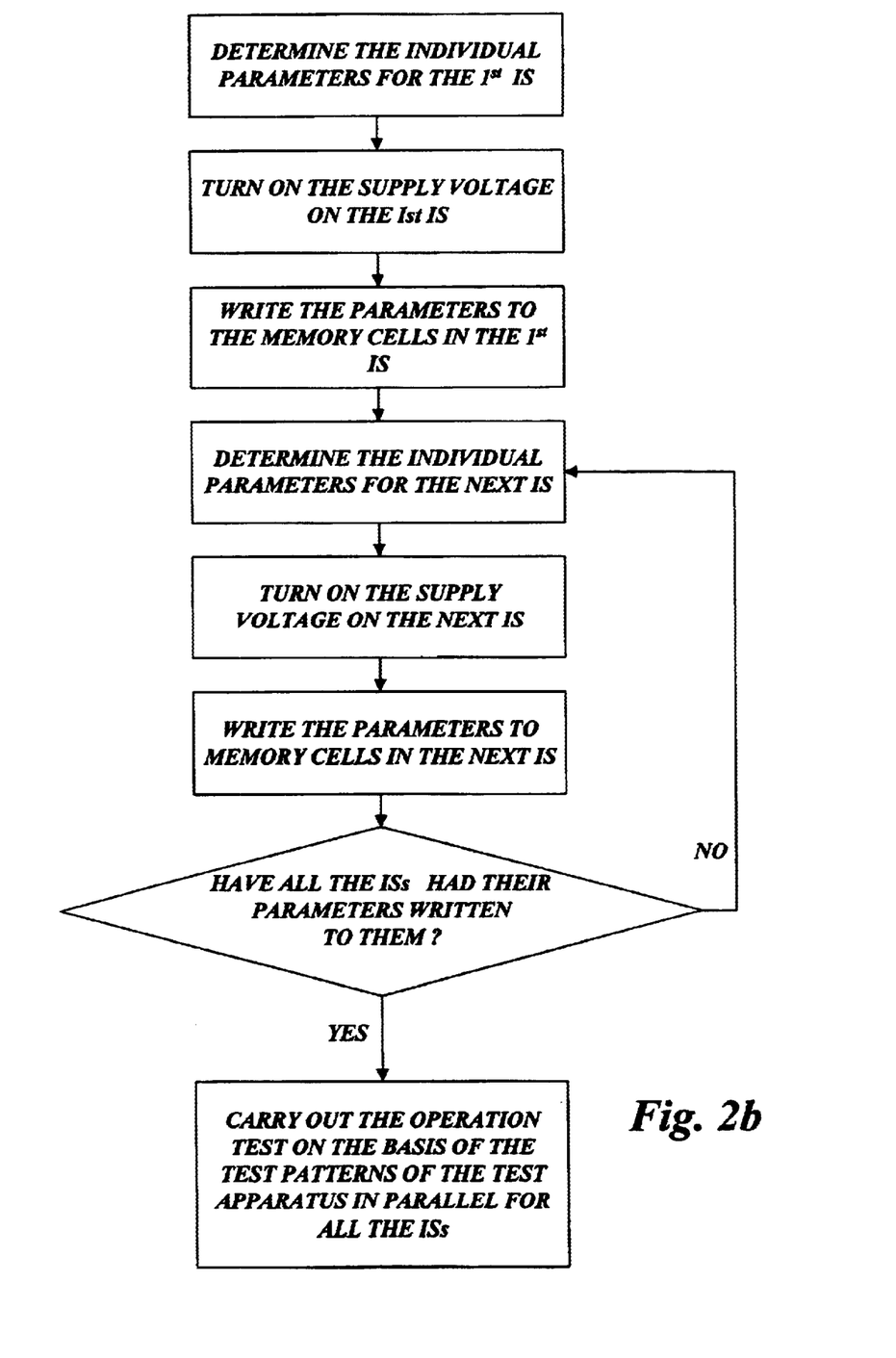
FIG. 2b is a flow chart of test procedures in accordance with a second embodiment.

Another exemplary embodiment of the inventive method is shown in FIG. 2b. First, the switching module SM1 is connected to the supply voltage VDD by the switch S1, and the required parameters which are optimum for the desired operation of the integrated circuit (i.e IS1) are determined for the memory cells MC by the control unit 1 on the basis of the respective specification for the circuit, step 100. In a subsequent step, the control unit 1 writes the parameters ascertained previously to the memory cells MC in the integrated circuit IS1 which has just been turned on, steps 110, 120. The next switching module SM2 is then supplied with the supply voltage VDD, so that the integrated circuit IS2 connected thereto is activated, step 130. The parameters which are optimum for the operation of this connected integrated circuit IS2 are now likewise determined. Next, these parameters are transferred to the memory cells MC in the integrated circuit IS2 concerned in the known manner, steps 140, 150. This procedure is repeated until the respective parameters have been written to the memory cells in all the connected integrated circuits, step 160, and then the operation test is started, step 170.

Since, in the exemplary embodiments shown in FIGS. 2a and 2b, the parameter settings stored in the memory cells MC are lost as soon as the voltage supply VDD is turned off, the previously turned-on integrated circuits on the respective switching modules also need to remain supplied with the voltage VDD during all the method steps relating to the respectively next integrated circuits. However, so that the storing of the parameters for the next integrated circuit does not cause the parameter settings to be overwritten in the integrated circuits to which information has previously been written, each integrated circuit IS contains an additional electronic circuit (FIG. 4) which permits information to be written to the memory cells MC only once after the supply voltage has been turned on. This prevents the memory cells MC from having information written to them after they have already been set individually. When the parameters of the respectively next integrated circuit are determined in this way, the test patterns provided for this purpose are also present on the integrated circuits that are likewise supplied with voltage. When the parameters are then written to the next integrated circuit, the electronic circuit prevents the integrated circuits to which the optimum parameters have already been written from having information written to them.

The required parameters can be determined in various ways. Thus, it is possible to use an operation performed by the test apparatus to determine the parameters by reverse calculation. To this end, a particular setting selected by the test program is first stored in the memory cells. The result or the resulting operation of the integrated circuit can now be used to determine the optimum parameters to be set for the integrated circuit by reverse calculation. Subsequent turning off and turning on again then prepares the memory cells to have the optimum parameters written to them in accordance with the inventive method.

Figure 3:
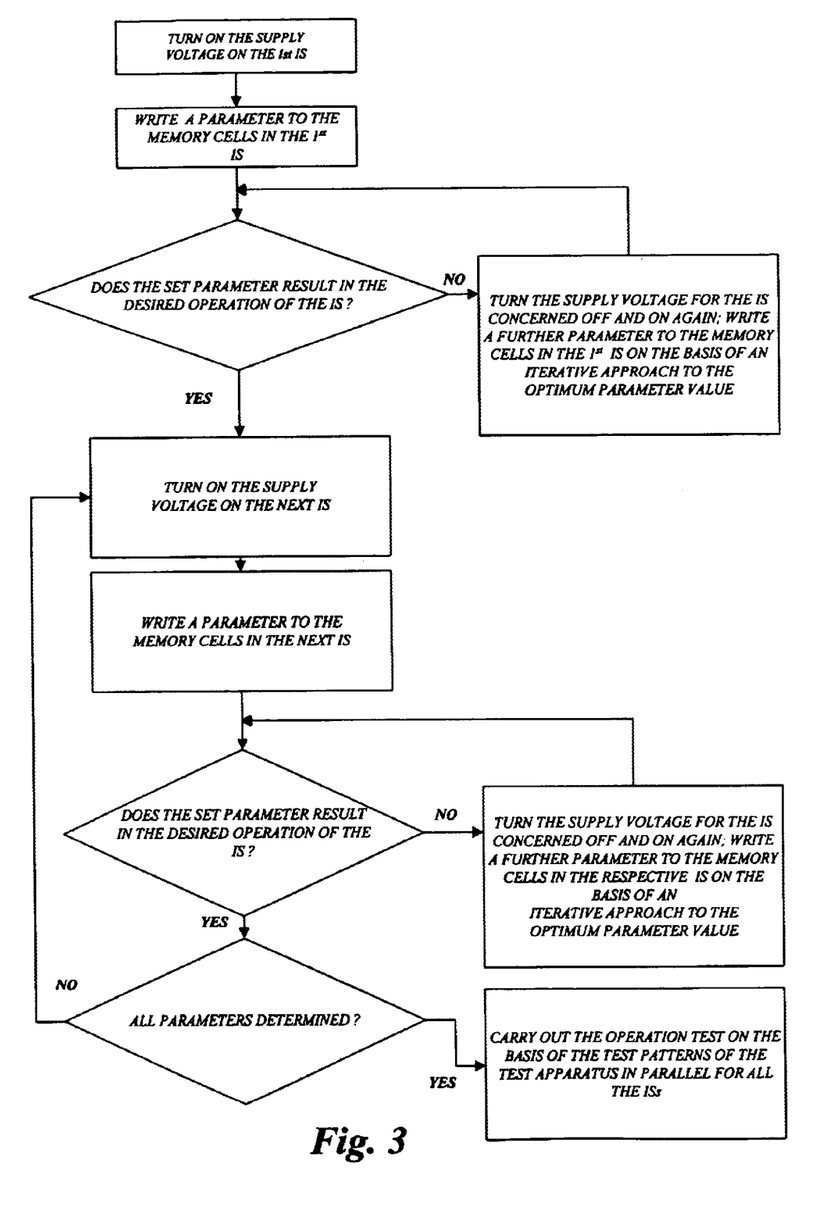
FIG. 3 is a flow chart of a method for determining optimum parameters of integrated circuits to be tested at the same time.

It is also conceivable, however, for the parameters that are optimum for the respective integrated circuit to need to be determined iteratively. Such a method of parameter determination is shown in FIG. 3. Accordingly, the first integrated circuit is turned on, step 200, then information is written to the memory cells MC, step 210. The operation of the integrated circuit is assessed 220. If the assessment is not considered to be optimum, the memory cells MC have information written to them again, until a situation sufficiently close to the desired manner of operation of the integrated circuit has been found. In this regard, to erase the memory cells MC and write information to them again, the supply voltage VDD needs to be turned off and then turned on again each time, step 230. If the optimum parameters for the integrated circuit IS concerned have then been determined, these steps are repeated with the next remaining integrated circuits, and the respective optimum parameters determined for the respective integrated circuit are stored in the test apparatus, steps 240–270. In this way, after the parameter determination for the integrated circuits, the memory cells have the previously determined parameters written to them, as shown in FIG. 2*a*, by virtue of the supply voltage being turned on successively, and the parallel operation test for all the connected circuits is then carried out. It is obvious to the person skilled in the art that this iterative method of parameter determination can also be used in connection with the method flow shown in FIG. 2*b*. After the parameters for all of the integrated circuits have been determined, step 280, the operational test is carried for all of the integrated circuits in parallel, step 290.

Figure 4:
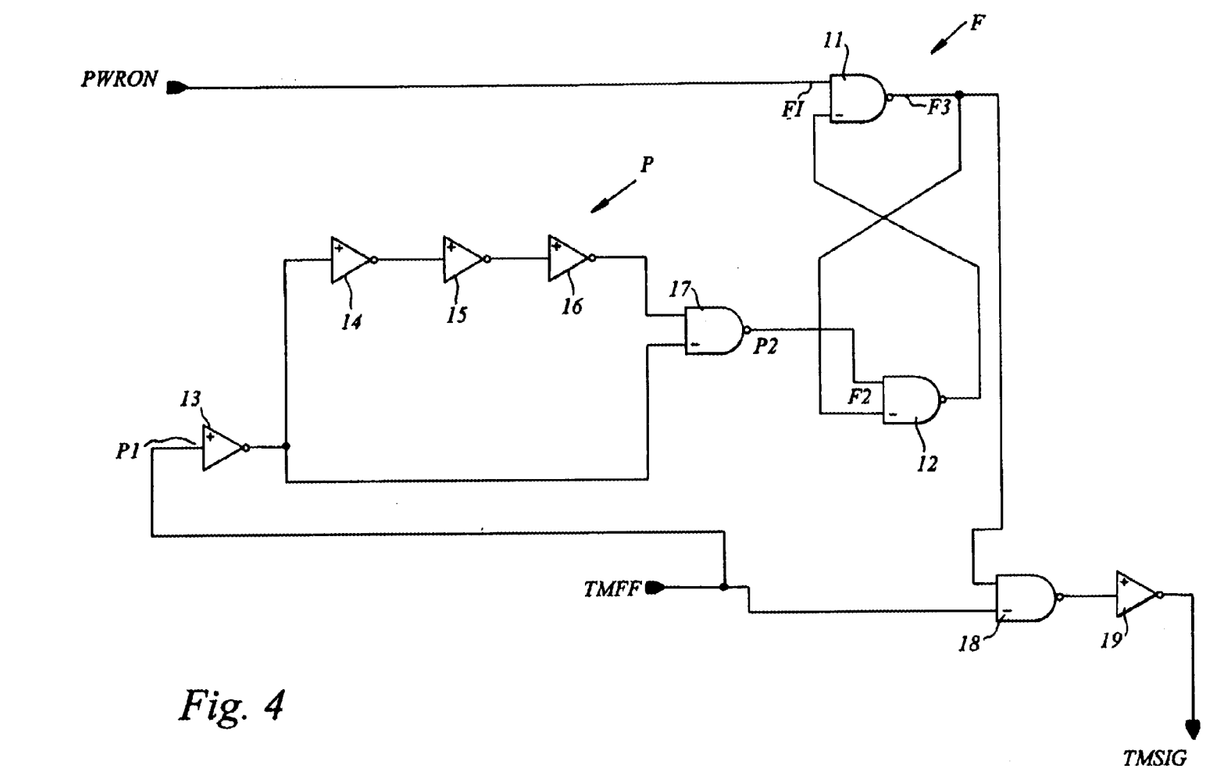
FIG. 4 is a circuit diagram of one possible circuit in accordance with the invention, which is inserted into an existing integrated circuit.

FIG. 4 shows, by way of example, one possible embodiment of the electronic circuit 6 implementing the inventive operation in the integrated circuit IS. The electronic circuit 6 shown in FIG. 4 has a flipflop F, containing two NAND gates 11, 12, and a pulse generator P containing four inverters 13, 14, 15 and 16 and a NAND gate 17. One input F1 of the flipflop F is connected to a signal PWRON, which indicates whether the supply voltage VDD is applied. Another input F2 of the flipflop F is connected to an output P2 of the pulse generator P. An input P1 of the pulse generator P is connected to a signal TMFF, which is a Write-Enable signal for the memory cells MC formed from latches. The Write-Enable signal is activated when the test apparatus wants to set the memory cells MC. An output F3 of the flipflop F and the signal TMFF are connected to the Write-Enable input TMSIG of the latches via a NAND gate 18 and an inverter 19.

A rising edge of the signal TMFF indicates that information is to be written to the latches MC. The rising edge is transmitted by the NAND gate 18 in inverted form, since, after the supply voltage has been applied, the output F3 of the flipflop F is at a logic "1". The falling edge concerned at the output of the NAND gate 18 is changed to a rising edge by the inverter 19. A falling edge of the signal TMFF now produces a rising edge at the output of the inverter 13, and hence at the input of the NAND gate 17. Since the delay time of the inverters 14, 15 and 16 results in that the output of the inverter 16 is changed from a logic "1" to a logic "0" with a time delay, the output of the NAND gate 17 produces a logic "0" at the input F2 of the flipflop F for the duration of the delay time of the inverters 14, 15 and 16, which causes the flipflop F to toggle. The output F3 of the flipflop F now produces a logic "0". A change in the state of the flipflop F can now be produced only by a level change in the signal PWRON, which occurs only after the supply voltage has been turned off, however. The logic "0" at the output of the flipflop F is applied to one input of the NAND gate 18, which thereby permanently produces a logic "1" at the output of the NAND gate 18, irrespective of the applied signal TMFF, and hence produces a logic "0" as TMSIG signal at the output of the inverter 19, which results in that writing to the latches is not permitted. A subsequently rising edge of the signal TMFF can therefore not cause any new writing to the latches.

In some testers, the PIN drivers 4 may not be able to be turned off at the same time as the supply voltage VDD. In this case, it is conceivable for a voltage level at an input of the integrated circuit to supply the chip with current via an ESD protective diode even after the supply voltage has been turned off. The result of this may be that, although a supply voltage is not applied, the memory cells in all the integrated circuits have information written to them, and then new writing is prevented after a supply voltage has been applied. This problem can be circumvented if, whenever the memory cells in the integrated circuit concerned have had information written to them, the input signals for all the components are grounded. Since the integrated circuits already connected in are connected to the supply voltage and can thus nevertheless hold their information, the integrated circuits that have not yet been connected in lose any information that has possibly been written to the memory cells unintentionally. This merely requires that the input signals be grounded for a sufficient length of time, e.g. (<10 ms), so that the internal supply voltage falls to a value of below 0.7 volts (via the ESD protective diode). The memory cells for the next integrated circuit to be set can then have information written to them, since this measure now results in that the memory cells have not been supplied with a supply voltage, and hence the memory cells have not had information written to them inadvertently.

The inventive features disclosed in the preceding description, in the claims and in the drawings may be fundamental to the implementation of the invention in its various embodiments both individually and in any desired combination.

We claim:

1. An integrated circuit, comprising:
   memory cells for storing test parameters; and
   an electronic circuit for carrying out an operational test and connected to said memory cells, said electronic circuit applying an operating signal and permitting a single write operation to said memory cells and preventing any further writing to said memory cells.

2. The integrated circuit according to claim 1, wherein the operating signal is a supply voltage for the integrated circuit.

3. The integrated circuit according to claim 2, wherein said electronic circuit has an input and an output, said input receives a control signal for writing to said memory cells and transmits the control signal to said output for the single write operation to said memory cells.

4. An integrated circuit, comprising:
   memory cells for storing test parameters; and
   an electronic circuit for carrying out an operational test and connected to said memory cells, said electronic circuit applying a supply voltage for the integrated circuit and permitting a single write operation to said memory cells and preventing any further writing to said memory cells, said electronic circuit having an input, an output, and a pulse generator with an input and a gate and a flip-flop connected to said pulse generator, said input of said electronic circuit receiving the supply voltage for writing to said memory cells and transmitting the supply voltage to said output for the single write operation to said memory cells, said flip-flop adopting a first state after the supply voltage has been turned on and adopting a second state when said pulse generator outputs a pulse received by said flip-flop on a basis of the control signal applied to said input of said pulse generator, and said gate being transmissive for the control signal in the first state on the basis of an output signal from said flip-flop and being non-transmissive in the second state.

5. The integrated circuit according to claim 1, wherein said memory cells are latches.

6. The integrated circuit according to claim 1, wherein a content of said memory cells contains an information item that is used to optimize an operation of the integrated circuit.

7. The test circuit according to claim 1, including severable lines, said memory cells simulating an operation of severed and unsevered lines.

8. The test circuit according to claim 1, wherein said memory cells can be used to set an internal reference voltage.

9. A test structure for a plurality of integrated circuits, comprising:

a test apparatus, where operating signals for the integrated circuits, can be connected individually by said test apparatus.

10. The test structure according to claim 9, wherein the test apparatus has outputs and said plurality of integrated circuits are connected in parallel to said outputs of said test apparatus, and the integrated circuits are tested using identical test patterns.

11. The test structure according to claim 9, wherein said test apparatus supplies a supply voltage successively to the integrated circuits connected in parallel as the operating signals, so that each of the integrated circuits already supplied remains supplied with the supply voltage until completion of an operational test.

12. A method for testing a plurality of integrated circuits, which comprises the steps of:

determining test parameters for each of the plurality of integrated circuits by a preliminary test and writing the test parameters determined to memory cells of associated ones of the integrated circuits; and carrying out a parallel operational test with all the integrated circuits.

13. A method for testing a plurality of integrated circuits, which comprises the steps of:

determining test parameters for each of the plurality of integrated circuits by a preliminary test and writing the test parameters determined to memory cells of associated ones of the integrated circuits by:

a1) applying an operating signal to one of the integrated circuits;

a2) determining the test parameters for the integrated circuit;

a3) writing the test parameters determined to the memory cells in the integrated circuit;

a4) applying the operating signal to a further one of the integrated circuits;

a5) determining the test parameters for the further integrated circuit;

a6) writing the test parameters determined to the memory cells of the further integrated circuit; and a7) repeating steps a4) to a6) until the test parameters have been determined for all the integrated circuits; and carrying out a parallel operational test with all the integrated circuits.

14. The method according to claim 13, wherein the memory cells in the integrated circuits can be written to only once during a test cycle, in which the operating signal for the integrated circuits is maintained.

15. The method according to claim 14, which comprises providing the operating signal as a supply voltage for the integrated circuits.

16. A method for testing a plurality of integrated circuits, which comprises the steps of:

determining test parameters for each of the plurality of integrated circuits by a preliminary test and writing the test parameters determined to memory cells of associated ones of the integrated circuits;

carrying out a parallel operational test with all the integrated circuits;

carrying out a check to determine whether the test parameters determined in the preliminary test ensure an optimum operation of each of the integrated circuits;

adopting the test parameters for the parallel operational test if the test parameters ensure the optimum operation; and determining the test parameters again if the test parameters do not ensure the optimum operation.

* * * * *